US008779755B2

(12) United States Patent
Kim et al.

(10) Patent No.: US 8,779,755 B2
(45) Date of Patent: Jul. 15, 2014

(54) APPARATUS FOR TESTING POWER SUPPLY UNITS BASED ON LIGHT EMITTING DIODE FLICKERS

(75) Inventors: Jin Sung Kim, Seoul (KR); Kyu Cheol Kang, Suwon-si (KR); Jin Woo Bae, Seoul (KR); Choul Ho Lee, Suwon-si (KR); Jong Yang Choo, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 284 days.

(21) Appl. No.: 13/316,075

(22) Filed: Dec. 9, 2011

(65) Prior Publication Data

US 2012/0146622 A1   Jun. 14, 2012

(30) Foreign Application Priority Data

Dec. 10, 2010   (KR) ........................ 10-2010-0126253

(51) Int. Cl.
*G01R 31/00*   (2006.01)
(52) U.S. Cl.
USPC ........................................ 324/96; 324/764.01
(58) Field of Classification Search
CPC ........................................................ G01R 31/00
See application file for complete search history.

(56) References Cited

U.S. PATENT DOCUMENTS 5,239,495 A * 8/1993 Nanno et al. ................... 713/321

FOREIGN PATENT DOCUMENTS

| CN | 2564849 Y | 8/2003 |
|---|---|---|
| JP | 58-202849 A | 11/1983 |
| JP | 2007-077720 A | 3/2007 |
| KR | 10-1994-0010807 | 12/1995 |
| KR | 20-1996-0014122 | 12/1997 |
| KR | 10-2002-0069943 | 5/2004 |
| TW | 201001152 A | 1/2010 |

OTHER PUBLICATIONS

European Search Report issued in European Application No. 11192737.2 issued on Apr. 2, 2012.
C. Rong., "Flickermeter used for different types of lamps", 9th International Conference on Electrical Power Quality and Utilisation, 2007. EPQU 2007.
T. Kim et al., "LED Lamp Flicker Caused by Interharmonics", Instrumentation and Measurement Technology Conference Proceedings, 2008. IMTC 2008, IEEE.
Taiwanese Office Action issued in Taiwanese Application No. 100145492 dated Jan. 21, 2014, 6 pgs.
Chinese Office Action issued in corresponding Chinese Application No. 201110416058.0, dated Nov. 28, 2013.

* cited by examiner

*Primary Examiner* — Minh N Tang
(74) *Attorney, Agent, or Firm* — McDermott Will & Emery LLP

(57) ABSTRACT

A test apparatus for a power supply unit is provided, which includes a body unit configured to define a space to receive a light emitting diode (LED) and to provide a test environment to test a supply state of power applied to the LED; and a test unit mounted in the body unit to face the LED and configured to detect flicker of the LED occurring when a power supply is abnormal. According to the foregoing structure, power supply with respect to the LED may be regularly detected and analyzed, thereby increasing quality of power supply with respect to the LED.

10 Claims, 3 Drawing Sheets

APPARATUS FOR TESTING POWER SUPPLY UNITS BASED ON LIGHT EMITTING DIODE FLICKERS

CROSS-REFERENCE TO RELATED APPLICATION

This application claims the benefit of Korean Patent Application No. 10-2010-0126253, filed on Dec. 10, 2010, in the Korean Intellectual Property Office, the disclosure of which is incorporated herein by reference.

BACKGROUND

1. Field of the Invention

The present invention relates to a test apparatus for a power supply unit, the test apparatus for testing quality of a light emitting diode (LED), and more particularly, to a test apparatus for a power supply unit, capable of testing a power supply state of the power supply unit through a flicker of an LED.

2. Description of the Related Art

A light emitting diode (LED) refers to a light source that emits light by converting electrical energy to optical energy. The LED exhibits a high response rate and low power consumption. Moreover, the LED has a long lifespan and therefore is environmental-friendly. Accordingly, the LED is widely applied to various fields such as a backlight source of a display device or a light source of lighting.

The LED emits light by being supplied with power through a predetermined power supply unit. When power supplied by the power supply unit is unstable, the light emitted from the LED may flicker as an indicator of a malfunction. That is, a flicker of the LED occurs when a current waveform of the power supplied to the LED is imbalanced.

Generally, a flicker showing a power supply state of a manufactured LED is checked by naked eyes of an operator. However, when the flicker is inspected by an operator, it is difficult to obtain objective data due to individual differences among operators. Accordingly, there is a desire for a method of accurately detecting the flicker of the LED so as to increase a quality of a power supply with respect to the LED.

SUMMARY

An aspect of the present invention provides a test apparatus for a power supply unit, the test apparatus that increases quality of power supply with respect to a light emitting diode (LED) by detecting flicker of the LED.

According to an aspect of the present invention, there is provided a test apparatus for a power supply unit, the test apparatus including a body unit configured to define a space to receive an LED and to provide a test environment to test a supply state of power applied to the LED, and a test unit mounted in the body unit to face the LED and configured to detect a flicker of the LED occurring when power supply is abnormal.

The test unit may be configured such that a distance with respect to the LED is adjustable.

The body unit may provide a darkroom environment isolated from an outside.

The body unit may include a first body configured to receive the LED, a second body configured to receive the test unit and to be separable from the first body, and a cover configured to selectively open at least a part of the second body, thereby selectively exposing the test unit.

The test unit may include a sensor unit configured to detect a flicker of light generated from the LED, and an adjustment unit configured to support the sensor unit and adjust a distance between the sensor unit and the LED.

The sensor unit may include a photodiode.

The adjustment unit may include a holder member configured to support the sensor unit such that the sensor unit faces the LED, a support member mounted to the body unit by passing through the holder member parallel to a direction in which the holder member and the LED face each other, and configured to include a plurality of fixing recesses, and a fixing member configured to be engaged with at least one of the plurality of fixing recesses of the support member through the holder member, thereby selectively fixing a position of the holder member with respect to the support member.

The body unit may include a heat radiation member disposed in the body unit to radiate heat generated from the LED.

According to another aspect of the present invention, there is provided a test apparatus for a power supply unit, the test apparatus including a body unit configured to include a space to receive an LED, and a test unit mounted in the body unit and configured to test a supply state of power applied to the LED through a flicker of light generated from the LED, wherein the body unit is openable to selectively expose the LED and the test unit to the outside.

The test unit may face the LED such that a distance with respect to the LED is adjustable.

The body unit may include a first body configured to receive the LED, a second body configured to receive the test unit and to be separable from the first body, and a cover configured to selectively expose an exposure hole formed through one side surface of the second body, the one side surface facing the test unit.

The test unit may include a sensor unit configured to detect the flicker of the light generated from the LED, and an adjustment unit configured to adjust a distance between the sensor unit and the LED by including a holder member supporting the sensor unit such that the sensor unit faces the LED, a support member mounted to the body unit by passing through the holder member parallel to a direction in which the holder member and the LED face each other, and a fixing member configured to selectively fix a position of the holder member with respect to the support member.

The body unit may include a heat radiation member disposed in the body unit to radiate heat generated from the LED.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
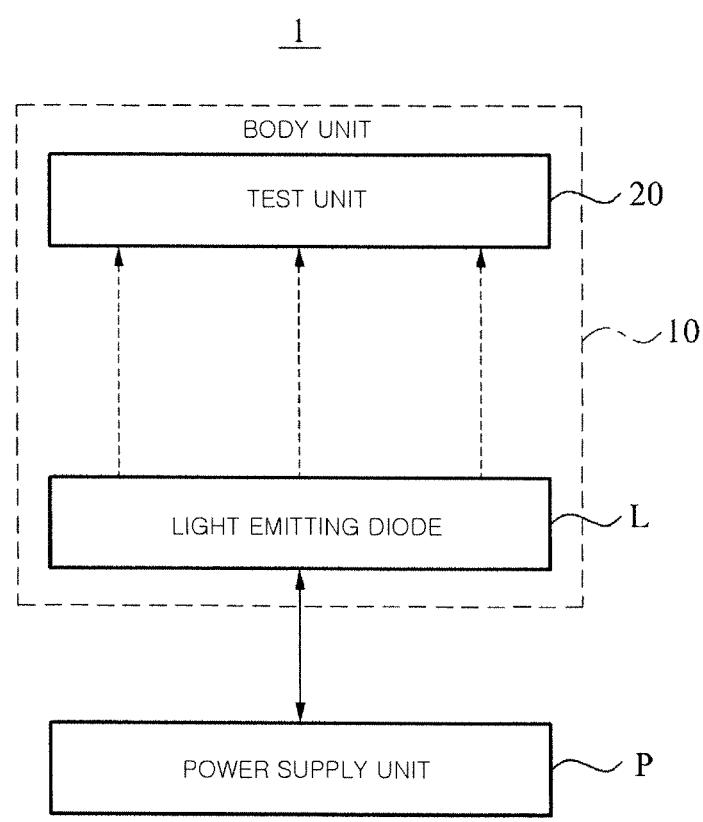
FIG. 1 is a view schematically illustrating a test apparatus for a power supply unit, according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Figure 2:
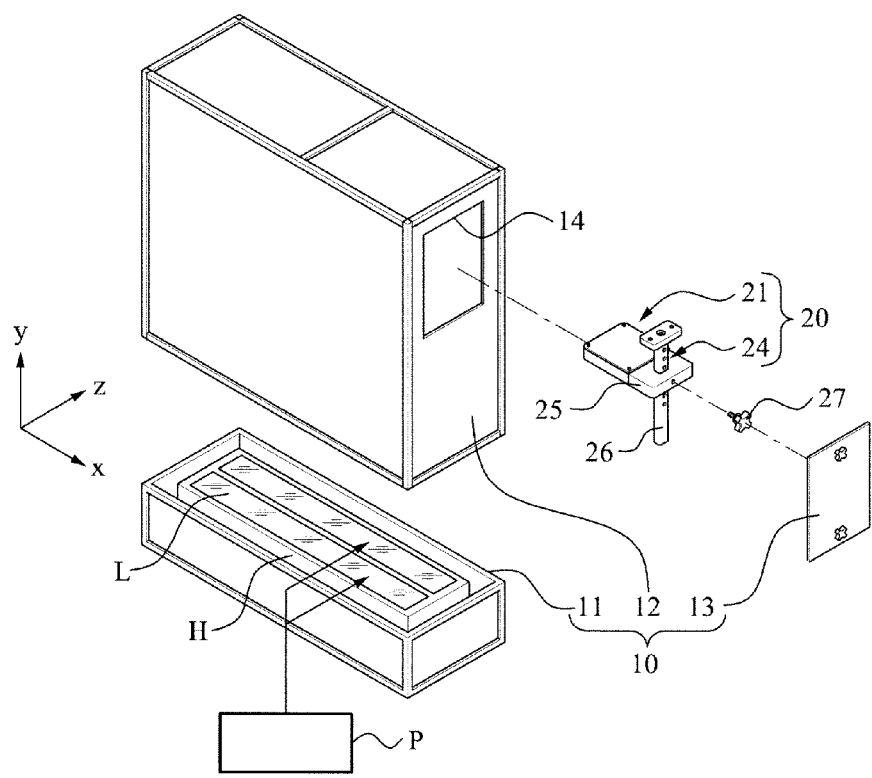
FIG. 2 is an exploded perspective view schematically illustrating a test apparatus for a power supply unit, according to an embodiment of the present invention.

FIG. 1 is a view schematically illustrating a test apparatus for a power supply unit, according to an embodiment of the present invention. FIG. 2 is an exploded perspective view schematically illustrating a test apparatus for a power supply unit, according to an embodiment of the present invention.

Referring to FIGS. 1 and 2, a test apparatus 1 for a power supply unit P, according to an embodiment of the present invention, includes a body unit 10 and a test unit 20.

The test apparatus 1 may detect a flicker of a light emitting diode (LED) L. The flicker is caused by abnormal power supply of the power supply unit P that supplies power to the LED L. That is, the test apparatus 1 for the power supply unit P tests a power supply state of the power supply unit P through the LED L.

The body unit 10 may include a space to receive the LED L, accordingly providing a test environment for the LED L. The body unit 10 may form a darkroom environment which is isolated to block out external light, except light generated from the LED L, during the test of the LED L for an accurate test of the LED L. As shown in FIG. 2, the body unit 10 may include a first body 11, a second body 12, and a cover 13.

The first body 11 may receive the LED L connected with the power supply unit P. All of a plurality of the LEDs L may be inserted in the first body 11 for simultaneous inspection of the flicker. In addition, the first body 11 may include a heat radiation member H, for example a heat sink, to radiate heat generated during driving in contact with the LED L. The heat radiation member H is inserted in the first body 11 along with the LED L.

The second body 12 may be inserted in the test unit 20 that will be described hereinafter, and configured to be separable from the first body 11. Here, the second body 12 may be stacked on an upper portion of the first body 11 to be separable in a vertical direction, that is, a y-axis direction. Accordingly, the upper portion of the first body 11 and a lower portion of the second body 12, facing each other, may be opened respectively.

The cover 13 may selectively open the second body 12, thereby selectively exposing the test unit 20. In particular, the cover 13 selectively exposes the test unit 20 built in the second body 12, to enable maintenance and repair or variation of test conditions. For this purpose, the cover 13 may be configured to selectively open and close an exposure hole 14 formed through one side of the second body 12.

Figure 3:
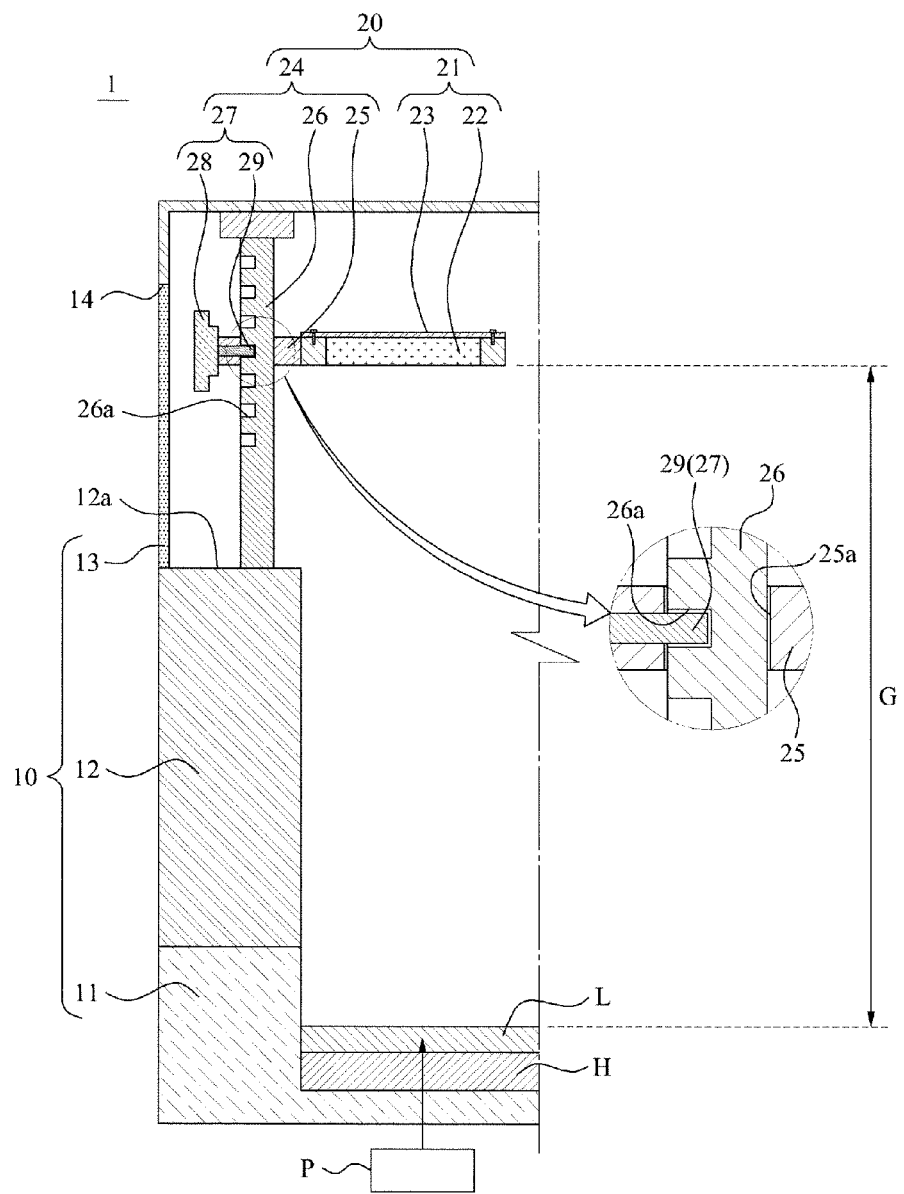
FIG. 3 is a sectional view schematically illustrating the test apparatus for a power supply unit, shown in FIG. 2.

The test unit 20 may be mounted in the body unit 10 to face the LED L, such that a distance with respect to the LED L is adjustable. The test unit 20 inspects the flicker occurring in the LED L. For this purpose, the test unit 20 may include a sensor unit 21 and an adjustment unit 24 as shown in FIGS. 2 and 3.

The sensor unit 21 may detect the flicker of the LED L occurring when power supply by the power supply unit P is performed abnormally. For this function, the sensor unit 21 may include a sensor 22 to detect light, and a substrate 23 electrically connected with the sensor 22 to process detected information. According to the present embodiment, the sensor 22 includes a photodiode.

The adjustment unit 24 may support the sensor unit 21, thereby adjusting a distance G between the sensor unit 21 and the LED L. As shown in FIG. 3, the adjustment unit 24 may include a holder member 25, a support member 26, and a fixing member 27. According to the present embodiment, the distance G between the sensor unit 21 and the LED L is within a range of about 10 millimeters (mm) to about 80 mm, however, is not limited thereto.

The holder member 25 may support the sensor unit 21 such that the sensor unit 21 and the LED L face each other. Referring to FIGS. 2 and 3, since the LED L and the sensor unit 21 are disposed in the first body 11 and the second body 12 being vertically stacked, the sensor unit 21 and the LED L face each other in the vertical direction, that is, the y-axis direction. However, the sensor unit 21 and the LED L may face each other in a horizontal direction, that is, in an x-axis direction. In this case, the first body 11 and the second body 12 may be connected in the x-axis direction.

The substrate 23 of the sensor unit 21 provided to the holder member 25 may be totally separated for maintenance and repair.

The support member 26 may be mounted to the body unit 10 by passing through the holder member 25, parallel to the y-axis direction in which the holder member 25 and the LED L face each other. The support member 26 may be connected to the holder member 25 by a connection hole 25a formed through one side of the holder member 25, the one side at which the sensor unit 21 is not disposed. One end of the support member 26 is fixed to an inside of the second body 12. The other end of the support member 26 is fixed by a support end 12a formed at the second body 12 so that a position of the support member 26 is fixed. According to the foregoing configuration, the holder member 25 moves up and down along the support member 26 in the y-axis direction, thereby adjusting the distance G between the sensor 21 and the LED L.

The fixing member 27 is inserted through the holder member 25 and fixed to at least one of a plurality of fixing recesses 26a provided at the support member 26. Specifically, the fixing member 27 is inserted in the at least one of the plurality of fixing recesses 26a, through one end of the holder member 25 in the x-axis direction, that is, perpendicular to the y-axis direction in which the holder member 25 and the LED L face each other. As shown in FIG. 3, the fixing member 27 includes a grab end 28 grabbed by an operator, and a fixing end 29 extended from the grab end 28 and inserted in the at least one of the plurality of fixing recesses 26a.

The fixing member 27 may face the exposure hole formed at the second body 12 so as to be selectively exposed by the cover 13. According to the foregoing configuration, when the inside of the second body 12 is opened by the cover 13, the operator may easily access an inside of the body unit 10 through the exposure hole 14 and operate the fixing member 27.

A test operation of the test apparatus 1 for the power supply unit according to the embodiment of the present invention will now be described with reference to FIGS. 2 and 3.

FIG. 3 is a sectional view schematically illustrating the test apparatus for a power supply unit, shown in FIG. 2.

As shown in FIG. 2, the LED L and the test unit 20 including the sensor unit 21 are disposed in the first body 11 and the second body 12, respectively. The LED L emits light through connection with the power supply unit P.

As the first body 11 and the second body 12 are connected to each other, an inside space defined by the first body 11 and the second body 12 is sealed, accordingly achieving the darkroom environment. When the LED L disposed in the first body 11 is operated, the sensor 22 of the sensor unit 21 facing the LED L may detect the flicker of the LED L, generated by abnormal power supply, and may provide the substrate 23 with information on the detected flicker.

When the flicker is inspected by adjusting the distance G between the LED L and the sensor unit 21 provided respectively in the first body 11 and the second body 12, the operator may separate the cover 13 connected with the exposure hole 14 of the second body 12, as shown in FIG. 2, and enter the inside of the second body 12. Next, the operator may separate the fixing member 27 fixed by engagement with one of the plurality of fixing recesses 26a formed at the support member 26 as shown in FIG. 3, and then move the released holder member 25 in the y-axis direction to a desired position. Finally, the operator may reinsert the fixing member 27 into one of the plurality of fixing recesses 26a, which is disposed in the connection hole 25a of the holder member 25, in the x-axis direction. Thus, the operator repositions and fixes the holder member 25.

When the operator wants to replace the LED L being tested, the second body 12 is separated from the first body 11 so that the LED L inserted in the first body 11 is exposed.

According to the foregoing structure, by inspecting a flicker of light generated from an LED, power supply with respect to the LED may be detected and analyzed, regularly.

Since a distance between the LED and a test unit that detects the flicker of the LED is selectively adjusted, various test conditions may be provided. As a consequence, power supply quality may be increased.

Since a darkroom environment is provided by blocking out external light during a test of the LED, accuracy of the test may be increased.

Since an inside of a body unit is selectively opened to exposure the LED, replacement of the LED may be facilitated.

In addition, an operator may easily access the inside of the body unit through an openable cover. Therefore, operability in the test may be increased.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A test apparatus for a power supply unit, the test apparatus comprising:
   (1) a body configured to define a space to receive a light emitting diode (LED) and to provide a test environment to test a supply state of power applied to the LED; and
   (2) a tester mounted in the body to face the LED and configured to detect a flicker of the LED occurring when power supply is abnormal,
   wherein the tester comprises (3) a sensor configured to detect the flicker of light generated from the LED, and (4) an adjustment unit configured to support the sensor and adjust a distance between the sensor and the LED, wherein the adjustment unit comprises (5) holder member configured to support the sensor such that the sensor faces the LED, (6) a support member mounted to the body by passing through the holder member parallel to a direction in which the holder member and the LED face each other, and configured to comprise a plurality of fixing recesses, and (7) a fixing member configured to be engaged with at least one of the plurality of fixing recesses of the support member through the holder member, thereby selectively fixing a position of the holder member with respect to the support member.

2. The test apparatus of claim 1, wherein the tester is configured such that a distance with respect to the LED is adjustable.

3. The test apparatus of claim 1, wherein the body provides a darkroom environment isolated from an outside.

4. The test apparatus of claim 1, wherein the body comprises:
   a first body configured to receive the LED;
   a second body configured to receive the tester and to be separable from the first body; and
   a cover configured to selectively open at least a part of the second body, thereby selectively exposing the tester.

5. The test apparatus of claim 1, wherein the sensor comprises a photodiode.

6. The test apparatus of claim 1, wherein the body comprises a heat radiation member disposed in the body to radiate heat generated from the LED.

7. A test apparatus for a power supply unit, the test apparatus comprising:
   a body configured to comprise a space to receive a light emitting diode (LED); and
   a tester mounted in the body and configured to test a supply state of power applied to the LED through a flicker of light generated from the LED,
   wherein the body is openable to selectively expose the LED and the tester to the outside, and wherein the tester comprises (1) a sensor configured to detect the flicker of the light generated from the LED, and (2) an adjustment unit configured to adjust a distance between the sensor and the LED by comprising a holder member supporting the sensor such that the sensor faces the LED, a support member mounted to the body by passing through the holder member parallel to a direction in which the holder member and the LED face each other, and a fixing member configured to selectively fix a position of the holder member with respect to the support member.

8. The test apparatus of claim 7, wherein the tester faces the LED such that a distance with respect to the LED is adjustable.

9. The test apparatus of claim 7, wherein the body comprises:
   a first body configured to receive the LED;
   a second body configured to receive the tester and to be separable from the first body; and
   a cover configured to selectively expose an exposure hole formed through one side surface of the second body, the one side surface facing the tester.

10. The test apparatus of claim 7, wherein the body comprises a heat radiation member disposed in the body to radiate heat generated from the LED.

* * * * *